United States Patent
Ni et al.

(10) Patent No.: US 11,049,718 B2
(45) Date of Patent: Jun. 29, 2021

(54) FABRICATION OF GROUP III-NITRIDE SEMICONDUCTOR DEVICES

(71) Applicant: Suzhou Han Hua Semiconductor Co.,Ltd, Suzhou (CN)

(72) Inventors: Xian-Feng Ni, Suzhou (CN); Qian Fan, Suzhou (CN); Wei He, Suzhou (CN)

(73) Assignee: SUZHOU HAN HUA SEMICONDUCTOR CO., LTD., Jiangsu (CN)

(*) Notice: Subject to any disclaimer, the term of this patent is extended or adjusted under 35 U.S.C. 154(b) by 30 days.

(21) Appl. No.: 16/294,500

(22) Filed: Mar. 6, 2019

(65) Prior Publication Data
US 2019/0371598 A1 Dec. 5, 2019

(30) Foreign Application Priority Data
Jun. 1, 2018 (CN) .......................... 201810554936.7

(51) Int. Cl.
*H01L 21/02* (2006.01)
*H01L 29/20* (2006.01)
(Continued)

(52) U.S. Cl.
CPC ...... *H01L 21/0254* (2013.01); *H01L 21/0262* (2013.01); *H01L 29/2003* (2013.01); *H01L 29/66462* (2013.01); *H01L 29/778* (2013.01)

(58) Field of Classification Search
CPC ......... H01L 21/02378; H01L 21/02458; H01L 21/02507; H01L 21/0254; H01L 21/02576;
(Continued)

(56) References Cited

U.S. PATENT DOCUMENTS

| 10,415,904 B1* | 9/2019 | Mulligan | C23C 16/26 |
| 2005/0087752 A1* | 4/2005 | Shur | H01L 29/7783 |
| | | | 257/97 |

(Continued)

FOREIGN PATENT DOCUMENTS

| CN | 103311124 A | 9/2013 |
| CN | 104465756 A | 3/2015 |
| CN | 105552108 A | 5/2016 |

OTHER PUBLICATIONS

Zhu Sahoxin et al, 2013, J.Semicond. 34 053004, "The effect of δ-doping and modulation-doping on Si-doped high Al content n-AlxGa1—xN grown by MOCVD" (Year: 2013).*
(Continued)

*Primary Examiner* — Duy T Nguyen
(74) *Attorney, Agent, or Firm* — Westerman, Hattori, Daniels & Adrian, LLP (57) ABSTRACT

The invention relates to a method to reduce the contact resistance of ohmic contact in group III-nitride high-electron mobility transistor (HEMT). A heavily n-type doped nitride layer with modulation doping is epitaxially grown on selected contact regions for use as ohmic contact layer. The method for producing the n++ ohmic contact layer includes at least the following: deposition of nitride HEMT epitaxial structure on substrates (such as SiC, silicon, sapphire, GaN etc), deposition in-situ or ex-situ mask for selective growth of n-contact, selective etching to create of openings within the mask layer, deposition of modulation doped n++ nitride ohmic contact layer followed by ohmic metal deposition. The modulation doping involves alternating epitaxy of high and low doped nitride layers with common n-type dopant such as Ge, Si etc. The modulation doping significantly increases the range of n-type doping without detrimental effect on the material quality of the contact layer.

17 Claims, 6 Drawing Sheets

(51) Int. Cl.
*H01L 29/66* (2006.01)
*H01L 29/778* (2006.01)

(58) Field of Classification Search
CPC ............ H01L 21/0262; H01L 29/0843; H01L 29/2003; H01L 29/207; H01L 29/66462; H01L 29/778
See application file for complete search history.

(56) References Cited

U.S. PATENT DOCUMENTS

| | | | |
|---|---|---|---|
| 2008/0176366 A1* | 7/2008 | Mita | H01L 29/66462 438/172 |
| 2009/0057688 A1* | 3/2009 | Hirayama | H01L 21/0254 257/86 |
| 2015/0311382 A1* | 10/2015 | Kim | H01L 33/04 257/13 |
| 2019/0305135 A1* | 10/2019 | Radosavljevic | H01L 21/02603 |

OTHER PUBLICATIONS

Suzuki et al., Extremely low on-resistance Enhancement-mode GaN-based HFET using Ge-doped regrowth technique, 2014 IEEE International Electron Devices Meeting, San Francisco, CA, 2014, pp. 11.1.1-11.1.4, doi: 10.1109/IEDM.2014.7047029. (4 pages).

Zhu, S. et al., The effect of δ-doping and modulation-doping on Si-doped high Al content n-AlxGa1—xN grown by MOCVD. J. Semicond. 34, 4-7 (2013). (4 pages).

Fritze, S. et al., High Si and Ge n-type doping of GaN doping—Limits and impact on stress. Appl. Phys. Lett. 100, (2012). (5 pages).

Office Action dated Nov. 20, 2018, issued in counterpart CN Application No. 201810554936.7, with English Translation. (13 pages).

Office Action dated Feb. 3, 2019, issued in counterpart CN Application No. 201810554936.7, with English Translation. (8 pages).

* cited by examiner

FIG. 6

FABRICATION OF GROUP III-NITRIDE SEMICONDUCTOR DEVICES

TECHNICAL FIELD OF THE INVENTION

The present disclosure relates generally to the method of fabricating Group III-nitride (GaN, AlN, InN, ScN, BN and/or their alloys) semiconductor devices, and more particularly to method of fabricating III-Nitride high electron mobility transistors (HEMTs).

BACKGROUND OF THE INVENTION

This invention is related to III-nitride based high electron mobility transistors (HEMT). Nitride materials include GaN, InN, and AlN, as well as the alloy materials such as AlGaN, InAlN, InGaN, etc. Due to their unique material properties, nitride materials especially AlGaN and InAlN are particularly suitable for HEMT devices capable of delivering high frequency, high power. The nitride based HEMT has found its applications in areas of mobile, satellite, radar communications, and proven its advantages over other semiconductor materials such as Si or GaAs.

The fabrication of GaN HEMT starts with epitaxy of nitride materials on substrates (typically SiC, Si, Sapphire, or GaN, etc) with metalorganic chemical vapor deposition (MOCVD) or molecular beam epitaxy (MBE). The typical epitaxy structure of nitride HEMT comprises of an optional nucleation layer (typically AlN or low-temperature GaN), a highly-resistive GaN template (or viewed as a buffer layer) and a barrier layer (such as AlGaN or AlInN). The epi wafer will be tested for essential materials properties. Once the epi wafer is characterized, and it will go through wafer fab process to form HEMT devices. Typically, ohmic contact metals (Ti/Al/Ni/Au) will be deposited on wafers and annealed to form ohmic contact with nitride materials. Then gate area is defined by typical photolithography process, and gate metal is subsequently deposited to the gate area to form gate contact. More advanced HEMT technologies will have different variations from the above-mentioned process. For example, technologies such as in-situ SiNx passivation, multiple 2DEG channel, different barrier materials, device isolation by dry etching, device passivation, field plate will be used for further improvement of device improvement.

One of the key factors for achieving high-performance radio-frequency (RF) performance of HEMT device is to reduce the access resistance. While the aggressive lateral scaling of source-drain access regions reduces the access resistance but at the cost of breakdown voltage (BV), the contact resistances between source and drain should be reduced as low as possible, preferable lower than 0.1 $\Omega$-mm. As an effort to reduce the on-state contact resistances between source and drain, US patent 2008/0176366 disclosed a selectively regrown n+GaN contact layer directly on AlGaN/GaN surface to form smooth contact surface. However, due to the nature of GaN epitaxy process, GaN bulk Si doping has its upper limit of Si $2\times10^{19}$-$6\times10^{19}$ cm$^{-3}$, which is typically not sufficiently high doping for forming satisfactory contact resistance. Further increase of Si concentration beyond $6\times10^{19}$ cm$^{-3}$ will lead to 3D epitaxial growth and result in un-coalesced surface, which is undesirable for subsequent ohmic contact metallization. Germanium (Ge) bulk doping of GaN by MOCVD has been reported recently (Appl. Phys. Lett. 100, 122104 (2012)), and it is shown that the doping level could be increased to $3\times10^{20}$ cm$^{-3}$. However, as reported by the authors, the Ge bulk doping at this high level will result in surface pits, which is detrimental to the reliability of ohmic contacts and therefore device performance Regrown n++GaN using Ge bulk doping has been reported (Extremely low on-resistance enhancement-mode GaN-based HEFT using Ge-doped regrowth technique, 2014 IEEE International Electron Devices Meeting, San Francisco, Calif., pp. 11.1.1-11.1.14). The contact resistance reported in the particular work is 0.9 $\Omega$-mm, which is not sufficiently low for formation of satisfactory ohmic contacts.

SUMMARY OF THE INVENTION

As a solution to improve the n-doping further, a method for achieve n++GaN with modulation Ge doping is disclosed. As compared to bulk doping, modulation doping method (alternating high and low doping for multiple cycles) has been demonstrated to be an effective way to increase doping range and to improve materials quality as well as surface morphology (2013, The effect of $\delta$-doping and modulation-doping on Si-doped high Al content n-Al$_x$Ga$_{1-x}$N grown by MOCVD, J. Semicond. 34, 053004). Because of the alternating doping method, the high Ge doped GaN layers within the modulation-doped structure could have much higher carrier concentration of $6\times10^{20}$-$7\times10^{20}$ cm$^{-3}$ without sacrificing the materials quality and final surface morphology, which can lead to extremely low contact resistance and therefore significantly enhanced device RF performance at high frequency.

One embodiment is a method for fabricating an III-Nitride semiconductor device. The embodiment includes but not limited to the following steps: (1) form a buffer layer on a substrate; (2) form a barrier layer on the buffer layer; (3) remove partial of the barrier layer to form two separated trenches; and (4) form two n++ nitride layers with modulation doping on the two trenches respectively, wherein the modulation doping involves alternating epitaxy of high and low doped layers.

In some related embodiments, the n++ nitride layer is formed by the regrowth of materials selected from the group consisting of GaN, InGaN, AlGaN, AlInGaN, other nitride material(s) and combination thereof.

In some related embodiments, the growth of the n++ nitride layer consists of a plurality of repetitive cycles, and wherein each cycle consists of two small periods of t1 and t2.

In some related embodiments, one option is that the high doped layer is formed during the t1 periods and the low doped layer is formed during the t2 periods, and another option is that the low doped layer is formed during the t1 periods and the high doped layer is formed during the t2 periods.

In some related embodiments, a Gallium source may be used to provide Gallium required by the growth of the n++ nitride layer, an additional metalorganic source may be used to provide additional metalorganic element required by the growth of the n++ nitride layer, and a dopant source to provide dopant required by the growth of the n++ nitride layer.

In some related embodiments, the additional metalorganic element is different than Gallium, and may be one or more of In, Al, and Group III element.

In some related embodiments, the Gallium source flow rate is kept as constant during t1 and t2 periods, the Indium (or the additional metalorganic element) flow rate during t1 period is lower than its flow rate during t2 period, and the n dopant flow rate during t1 period is higher than its flow rate during t2 period.

In some related embodiments, the Gallium source flow rate is zero during t1 period and higher than zero during t2 period, the Indium (or the additional metalorganic element) flow rate during t1 period is lower than its flow rate during t2 period, and the n dopant flow rate during t1 period is higher than the n dopant flow rate during t2 period.

In some related embodiments, the Gallium source flow rate is greater than zero during at least one of periods t1 and t2, also the Gallium source flow rate is in the range of 0.01 L/min to 5 L/min during at least one of periods t1 and t2.

In some related embodiments, the additional metalorganic element flow rate is greater than or equal to zero during at least one of periods t1 and t2, also the additional metalorganic element metal flow rate is less than 5 L/min during at least one of periods t1 and t2.

In some related embodiments, the n dopant flow rate is greater than or equal to zero during at least one of periods t, also the n dopant flow rate is less than 5 L/min during at least one of periods t1 and t2.

In some related embodiments, an option is that the thickness of the layers grown during t1 and t2 periods is in the range of 1 nm to 500 nm, another option is that the thickness of the layers grown during t1 and t2 periods is adjusted by tuning the time duration of each of periods t1 and t2, the other option is that the thickness of the layers grown during t1 an t2 periods is adjusted by tuning the Gallium flow rate, also one more option is that the growth duration of t1 or t2 periods is in the range of 1 second to 15 minutes.

In some related embodiments, the n dopant source is chosen from a group consisting of Ge with germane gas, Ge with tetramethylgermane vapor and combination thereof.

In some related embodiments, wherein the n dopant source is chosen from a group consisting of $SiH_4$, $Si_2H_6$, $GeH_4$ and combination thereof, and wherein the dopant source is balanced in one or more of the following: $N_2$, $H_2$ or inert gas (such as Ar).

In some related embodiments, the n dopant is chosen from a group consisting of Si, Ge, Oxygen and combination thereof.

In some related embodiments, the high doped layer has doping level up to $6 \times 10^{20}$ cm$^{-3}$ to $7 \times 10^{20}$ cm$^{-3}$ and the low doped layer has doping level at $1 \times 10^{19}$ cm$^{-3}$ to $1 \times 10^{20}$ cm$^{-3}$ so as to achieve overall $2 \times 10^{20}$ cm$^{-3}$ doping level.

In some related embodiments, the thickness of the n++ nitride layer is in the range from 100 nm to 1 um.

In some related embodiments, the top surface of the n++ nitride layer is higher than that of the barrier layer so that the n++ nitride layer has exposed sidewalls, also the top surface of the n++ nitride layer is optional higher than that of the passivation layer formed on the barrier layer so that the n++ nitride layer has exposed sidewalls.

In some related embodiments, the top part of the buffer layer is removed during the step removing partial of the barrier layer.

In some related embodiments, the removed thickness of the top part of the buffer layer is 1 nm to 1 um.

The invention relates to the fabrication of group III-nitride semiconductor devices. Specifically, it discloses a method to reduce the contact resistance of ohmic contact in group III-nitride high-electron mobility transistor (HEMT). A heavily n-type doped (n++, >$1 \times 10^{20}$ cm$^3$ doping level) nitride layer with modulation doping is epitaxially grown on selected contact regions for use as ohmic contact layer. The disclosed method reduces the on-state contact resistance without significant reduction of materials quality of the contact layer, which is normally observed in prior art, and potentially causes reliability issues of HEMT devices. The method for producing the n++ ohmic contact layer includes (but not limited to) the following steps: deposition of nitride HEMT epitaxial structure on substrates (such as SiC, silicon, sapphire, GaN etc), deposition in-situ or ex-situ mask for selective growth of n-contact, selective etching to create of openings within the mask layer, deposition of modulation doped n++ nitride ohmic contact layer followed by ohmic metal deposition. The modulation doping involves alternating epitaxy of high and low doped nitride layers with common n-type dopant such as Ge, Si etc. The modulation doping significantly increases the range of n-type doping without detrimental effect on the material quality of the contact layer.

BRIEF DESCRIPTION OF THE DRAWINGS

Embodiments of the present invention will be readily understood by the following detailed description in conjunction with the accompanying drawings. To facilitate this description, like reference numerals designate like structural elements. Embodiments of the invention are illustrated by way of example and not by way of limitation in the figures of the accompanying drawings.

BRIEF DESCRIPTION OF THE PREFERRED EMBODIMENTS

In order to achieve sufficiently low contact resistance, a new regrowth method is disclosed in the present invention with modulation doped n++ nitride materials. The dopant is preferably Ge with germane gas source, but it could be Si, Ge, O, or other dopants. The modulation doping is essentially alternating high and low doping for many periods by changing the flow rate of the n-type dopant for the high/low doping layers.

Figure 1:
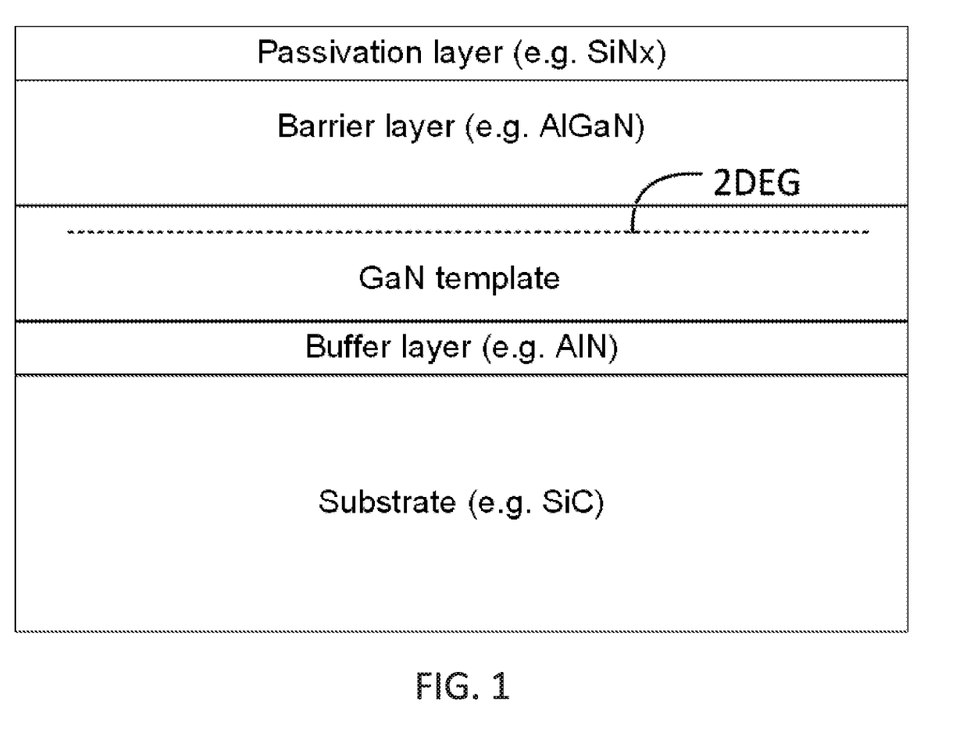
FIG. 1 illustrates an epitaxial structure of a typical nitride based HEMT device after epitaxy step. (the figure as well as other figures are a schematic representation of the epitaxy structure, and the dimension of each layer does not represent actual material thickness).

The details of the present invention are described as below. The fabrication process starts with epitaxy of nitride HEMT layer on substrate (typically SiC or Si etc). As shown in FIG. 1, the first epitaxial is buffer layer, which serves to reduce the lattice mismatch between GaN and substrate and improves the crystalline quality of the epitaxy materials. It is typically MN layer if SiC substrates are used. Then an unintentionally un-doped GaN or highly resistive GaN (through Fe doping) is deposited on top of the nucleation layer to serve as template (or viewed as a buffer layer) for subsequent epitaxy of HEMT device. To improve the mobility of the 2DEG channel, the growth conditions of the top part of the buffer layer (or viewed as GaN template) could be adjusted to be different from that of the initial part in terms of doping and other growth parameters. Subsequently, to form 2DEG conducting channel within GaN template (i.e., buffer layer), a barrier layer (typically AlGaN, or AlInN which has larger bandgap, or a combination of a few different types of alloy nitrides) is deposited on top of the buffer layer (i.e. GaN template). Afterwards, a passivation layer (preferably in-situ SiNx formed with SiH4 and NH3 gases within the same epitaxy chamber) is deposited on top of the nitride epi structure. It should be noted that an optional dielectric films including SiNx, SiO2, or a combination of both may be deposited on top of the passivation layer to increase the total thickness of passivation/dielectric layer to a point so that it could withstand the high growth temperature during regrowth step.

Figure 2:
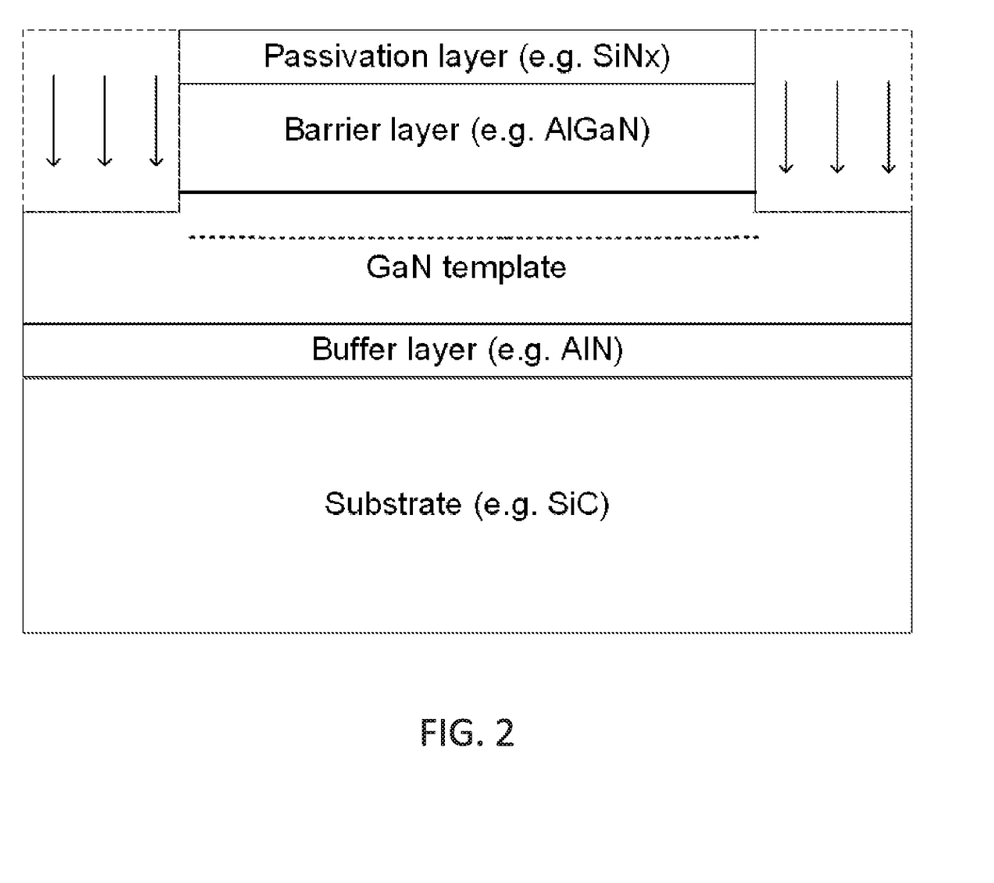
FIG. 2 illustrates an epi wafer selectively etched to expose the area for regrowth of contact layer. The area definition could be achieved through photolithography and dry etching processes. The etching removes the passivation layer, barrier layer as well as part of GaN template.

Once the above epitaxial growth step is finished, the wafer will go through photolithography process to form opening area for subsequent regrowth of contact materials. The details are described as follows. A layer of photoresist is spin coated on top of the epi wafer. With photolithography process, the photoresist is then selectively exposed and removed in the areas where regrowth is needed. Then the wafer is dry etched to remove the passivation layer. The barrier layer and top part of the GaN template could also dry etched to expose GaN surface. The wafer after the dry etching is shown in FIG. 2. It is noted that in the present invention, the etching of nitride materials may not be required for subsequent n++ regrowth, i.e. the regrowth could be carried out with or without the dry etching of the nitride materials.

Figure 3:
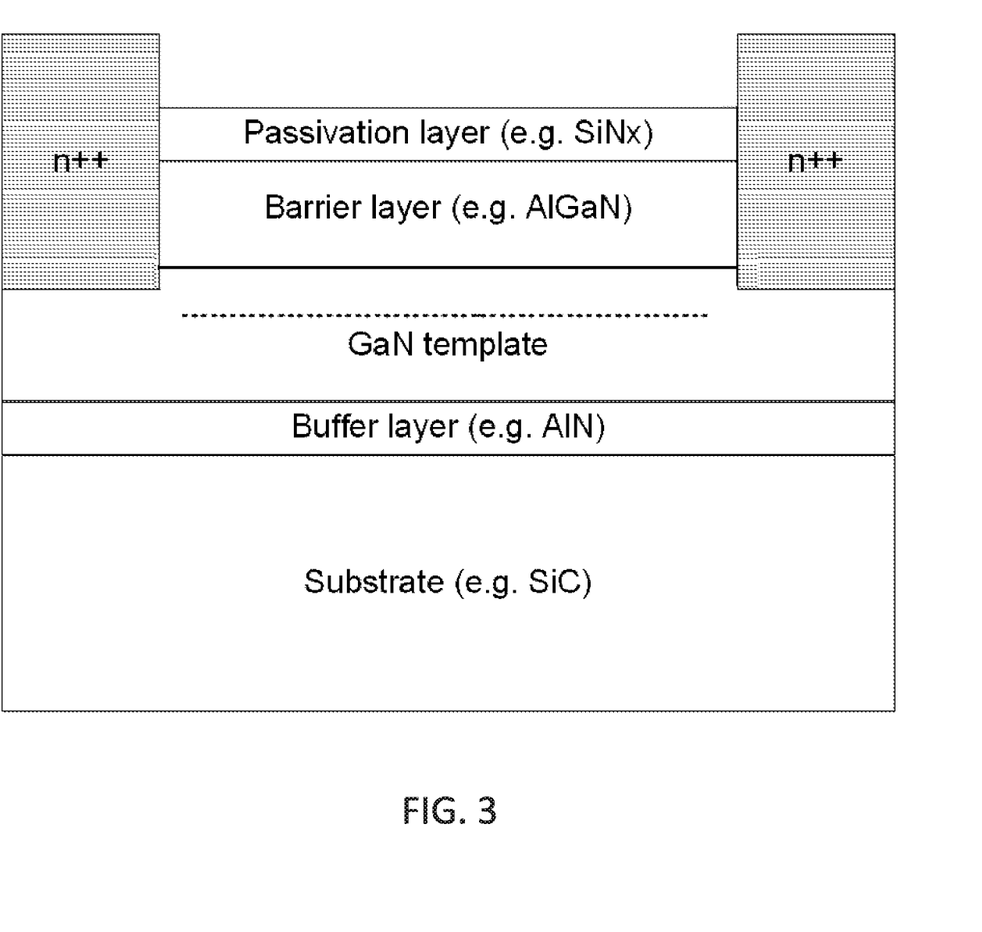
FIG. 3 illustrates an epi wafer after regrowth of modulation doped n++ nitride materials (such as GaN, or InGaN) for ohmic contact.

After the regrowth area is exposed, the wafer is then loaded to growth chamber such as MOCVD for regrowth of n++ contact nitride materials. The present invention utilizes modulation doping to achieve high-material-quality n++ nitride layers. Due to amorphous nature of the passivation layer, no nitride materials will be deposited on the passivation layer. The dopant is preferably Ge with germane gas as source. The doping of Ge is controlled by varying the germane gas flow rate. The modulation doping consists of repetitive two layers with high and low doping. To achieve overall $2 \times 10^{20}$ cm$^3$ doping level (for example) of the contact layer, the high doped layers typically have doping levels up to $6-7 \times 10^{20}$ cm$^{-3}$, while the low doped layers have doping levels at $1 \times 10^{19}$ to $1 \times 10^{20}$ cm$^{-3}$. Due to the relatively high growth temperature, the dopant of the high doped layers will diffuse into neighboring low doped layers. Therefore, the final actual doping profile within the contact layer could differ from design. The relative thicknesses for the high and low doped layers could be different and need to be optimized to achieve optimum surface morphology and doping level. The regrowth materials could be GaN, InGaN, AlGaN, AlInGaN, and other nitride materials. As compared with n++GaN, the optimum growth temperature for InGaN could be lower, while the carrier mobility might not as high. It should be pointed that the regrown n++ layer thickness (ranging from ~100 nm to ~1 um) might be higher than passivation layer, thus forming exposed sidewalls as shown in FIG. 3.

Figure 4:
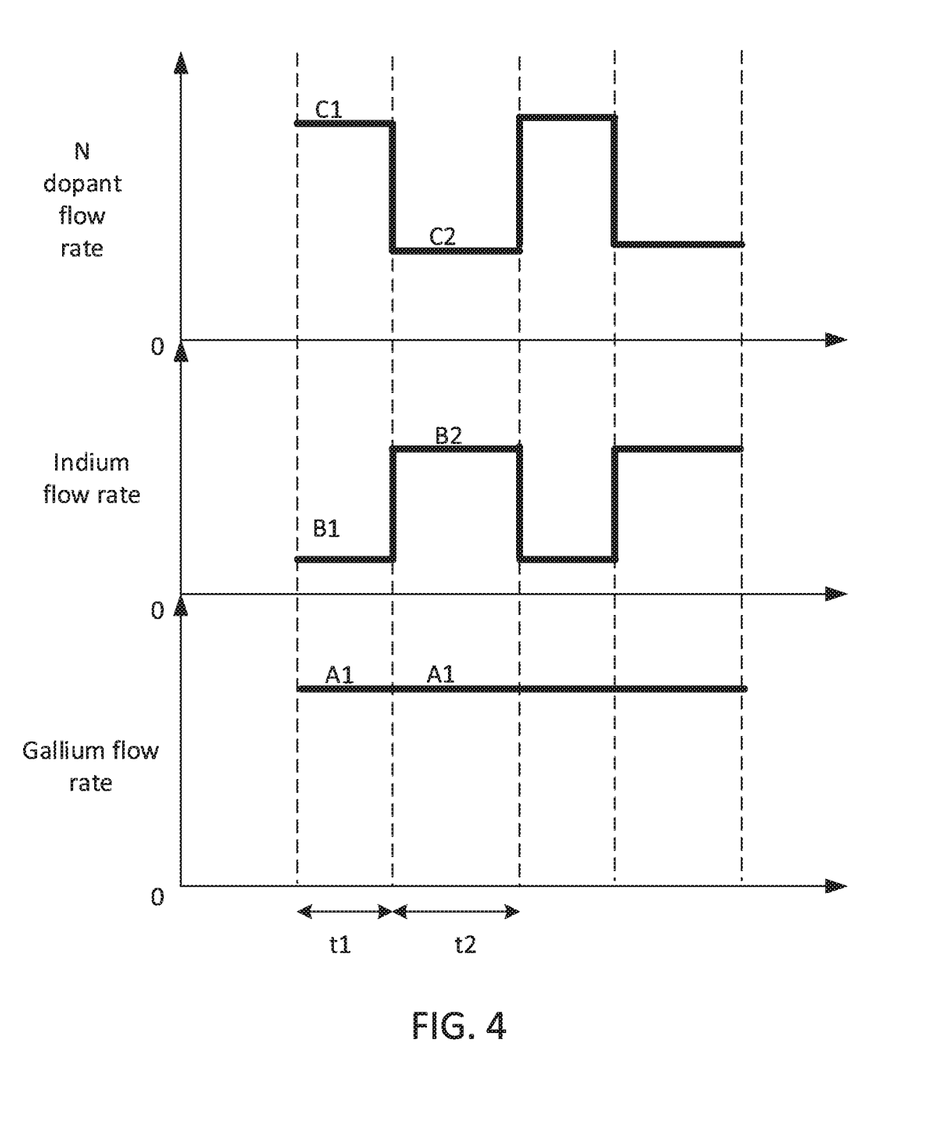
FIG. 4 illustrates source flow rates for one example of the invention of n++ contact growth.

FIG. 4 shows the gas flow rates during the n++ contact growth in one example. Each cycle of n++ contact growth consists of two small periods of t1 and t2. The growth consists of multiple repetitive cycles of small periods of t1 and t2 as shown in FIG. 4. During the periods of t1 and t2, the Gallium source flow in this example is kept as constant. As shown in FIG. 4, the n dopant flow rate (C1) during t1 period is higher than that (C2) during t2 period, thereby resulting in high and low n dopant concentrations during the t1 and t2 periods, respectively. To reduce the contact resistant further, the Indium flow is also modulated: the Indium flow rate (B2) during t2 period is higher than that (B1) during t1 period. This flow rate change relatively increases the Indium incorporation into the contact during the t2 period as compared to that during t1 period. Higher Indium content will result in lower contact resistance. Although the absolute n dopant flow rate is lower for the layers during t2, the relatively higher Indium content during the t2 period reduces the layer resistance to a level which could be comparable to the resistance during t1 period. Thereby, an overall much lower contact resistance is obtained with the gas flow scheme. The n dopant could be SiH4, Si2H6, or GeH4 balanced in inert gas, such as Ar, $H_2$ or $N_2$. It should be noted that B1 and C2 could be zero or values above zero. The flow rate C1 is greater than C2, and is less than 5 L/min in practice. The flow rate B2 is greater than B1, and is less than 5 L/min in practice. The Gallium source could be TMGa or TEGa, its flow rate A1 in the example is typically in the range of 0.01 L/min-5 L/min. The thickness for the layers grown during t1 and t2 period are in the range of 1 nm-500 nm, and could be adjusted by tuning the time duration of each period as well as by tuning the Gallium flow rate (A). The growth duration of t1 or t2 periods is in the range of 1 s-15 min.

Figure 5:
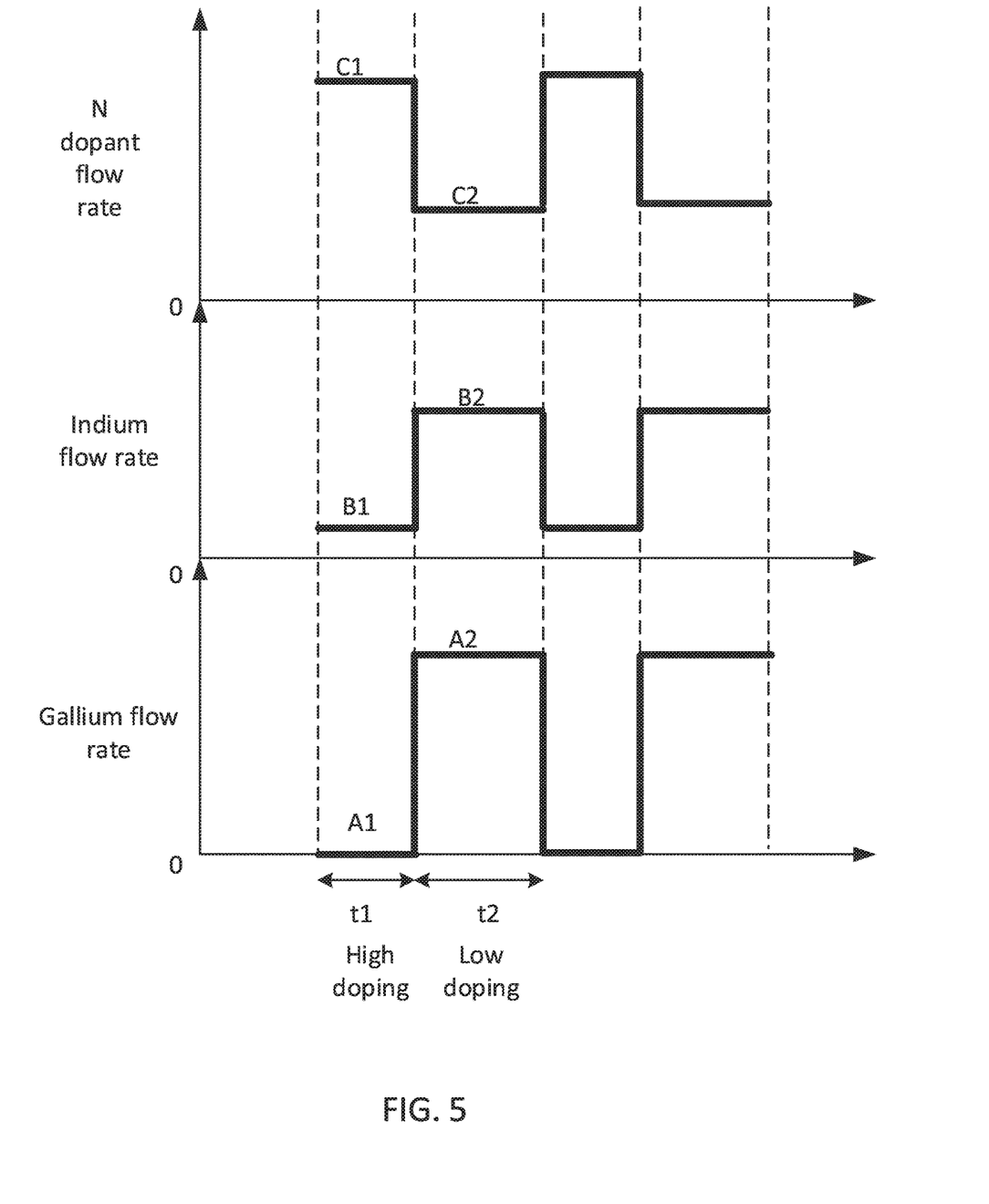
FIG. 5 illustrates source flow rates for another example of the invention of n++ contact growth.

FIG. 5 shows another example of gas flow rates for the n++ contact growth. While N dopant and Indium flow rates are same as the example in FIG. 1, the Gallium flow rate is now zero (i.e. no Gallium source supply) during t1 period, and increases to A2 during t2 period. The n dopant and Indium flow rates are varied in a similar way as described in the previous example. During t1 period, the dopant is introduced and accumulated on wafer surface, and diffuses into the neighboring layers grown at t2 periods, thereby resulting in high/low/high/low alternating n doping profile. Similarly, the relatively higher Indium flow rate (B2) during t2 period further reduces the overall contact resistance.

Figure 6:
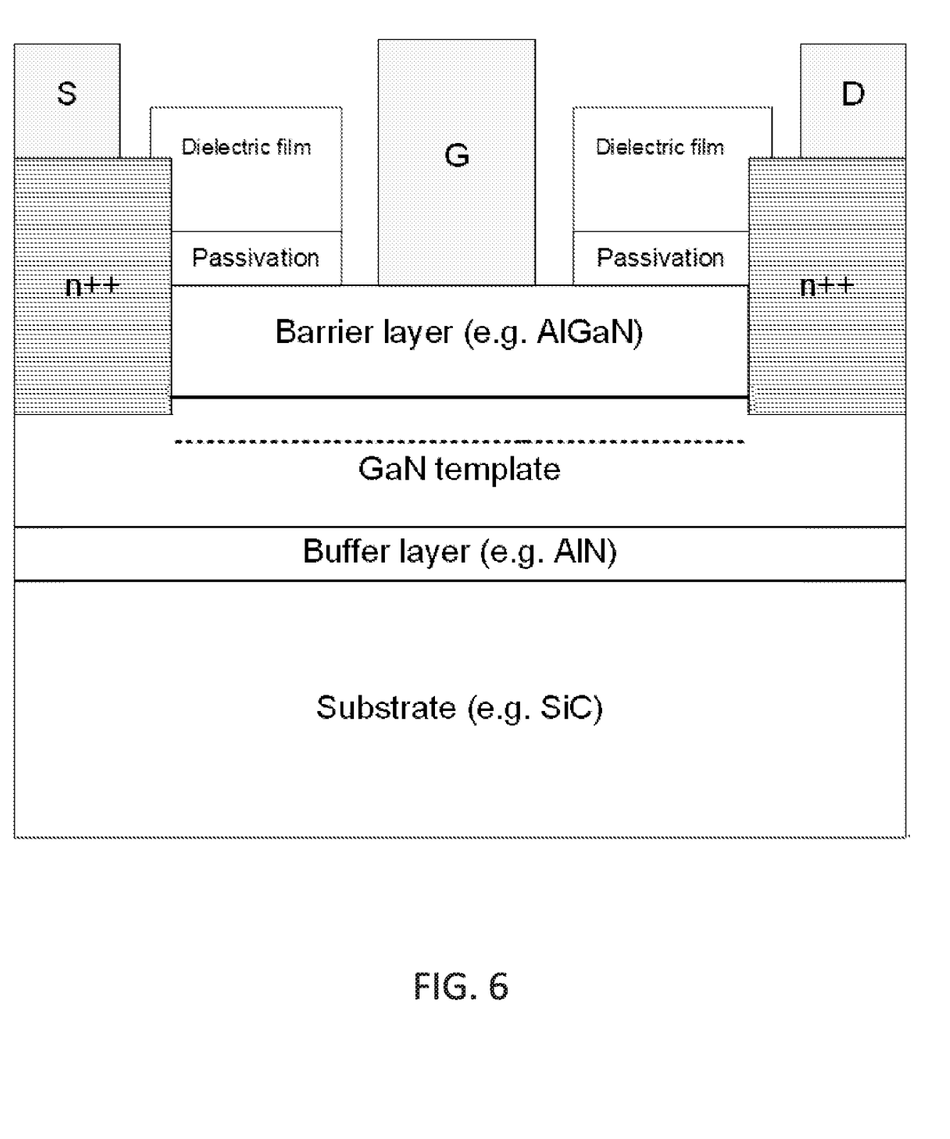
FIG. 6 illustrates an HEMT device with ohmic metal contacts (source "S" and drain "D" contacts) on regrown n++ nitride contact layer, and gate metal contact "G" on barrier layer.

In order to passivate the exposed sidewall of the regrown n++ contract materials, a dielectric film (such as SiO2 or SiNx) is deposited uniformly across the wafer. After photolithography to create openings through the dielectric film for source and drain contacts, ohmic metal (typically Ti/Al/Ni/Au stack) is deposited on top of n++ contact layer to form ohmic contacts. The metal together with photoresist over the other areas than the openings will be removed using lift-off process. Anneal of the ohmic metal stack might be optional to create good ohmic contact. Finally, in a similar way, gate metal (typically Ni/Au) is selectively deposited on top of the barrier layer to form the gate contact, as shown in FIG. 6.

Although the invention has been illustrated and described with respect to several preferred embodiments thereof, various changes, omissions and additions to the form and detail thereof, may be made therein, without departing from the spirit and scope of the invention. Modifications and changes may be made within the scope of the invention, which is defined by the appended claims.

What is claimed:

1. A method for fabricating a Group III-Nitride semiconductor device, comprising:
    forming a buffer layer on a substrate;
    forming a barrier layer on the buffer layer;
    forming a passivation layer on the barrier layer;
    removing partial of the passivation layer and partial of the barrier layer to form two separated trenches; and performing a regrowth to form two n++ nitride layers with modulation doping on the two trenches;

wherein the modulation doping involves alternating epitaxy of high and low doped layers, the passivation layer prevents the regrowth from forming an n++ nitride layer on the passivation layer, and the two n++ nitride layers are separated; and the regrowth includes a plurality of repetitive cycles, and each of the repetitive cycles includes two periods of t1 and t2, a Gallium source flow rate is zero during t1 period and higher than zero during t2 period, and an additional metalorganic element flow rate during t1 period is lower than the additional metalorganic element flow rate during t2 period; and the modulation doping includes n-type doping, and an in dopant flow rate of the n-type doping during t1 period is higher than the n dopant flow rate of the n-type doping during t2 period.

2. The method of claim 1, wherein the n++ nitride layers are formed by the regrowth using materials selected from the group consisting of GaN, InGaN, AlGaN, AlInGaN, other nitride material(s) and combination thereof.

3. The method of claim 1, further comprising one of the following:

the high doped layer being formed during the t1 periods and the low doped layer being formed during the t2 periods; and the low doped layer being formed during the t1 periods and the high doped layer being formed during the t2 periods.

4. The method of claim 1, further comprising one or more of the following:

using a Gallium source to provide Gallium required by the regrowth;

using an additional metalorganic source to provide additional metalorganic element required by the regrowth; and using a dopant source to provide dopant required by the regrowth.

5. The method of claim 4, further comprising at least one of the following:

the additional metalorganic element being different than Gallium; and the additional metalorganic element being chosen from a group consisting of In, Al, Group III elements and combination thereof.

6. The method of claim 5, wherein the n dopant source of the two n++ nitride layers is chosen from a group consisting of Ge with germane gas, Ge with tetramethylgermane vapor and combination thereof.

7. The method of claim 5, wherein the n dopant source of the two n++ nitride layers is chosen from a group consisting of $SiH_4$, $Si_2H_6$, $GeH_4$ and combination thereof, and wherein the n dopant source of the two n++ nitride layers is balanced in one or more of the following: $N_2$, $H_2$, Ar or other inert gas.

8. The method of claim 5, wherein the n dopant source of the two n++ nitride layers is chosen from a group consisting of Si, Ge, Oxygen and combination thereof.

9. The method of claim 1, wherein the high doped layer has doping level up to $6\times10^{20}$ $cm^{-3}$ to $7\times10^{20}$ $cm^{-3}$ and the low doped layer has doping level at $1\times10^{19}$ $cm^{-3}$ to $1\times10^{20}$ $cm^{-3}$ so as to achieve overall $2\times10^{20}$ $cm^{-3}$ doping level.

10. The method of claim 1, wherein a thickness of the two n++ nitride layers ranges from 100 nm to 1 um.

11. The method of claim 1, wherein a thickness of the two n++ nitride layers are larger than a depth of the two separated trenches so that the two n++ nitride layers exposes sidewalk after the regrowth.

12. The method of claim 1, further comprising removing a top part of the buffer layer during removing the partial of the passivation layer and the partial of the barrier layer.

13. The method of claim 12, wherein a thickness of the top part of the buffer layer removed ranges from 1 nm to 1 um.

14. The method of claim 1, wherein the additional metalorganic element flow rate is less than 5 L/min during at least one of periods t1 and t2.

15. The method of claim 1, further comprising one or more of the following:

the n dopant flow rate being greater than or equal to zero during at least one of periods t1 and t2; and the n dopant flow rate being less than 5 L during at least one of periods t1 and t2.

16. The method of claim 1, further comprising at least one of the following:

a thickness of the layers grown during t1 and t2 periods being in the range of 1 nm to 500 nm;

the thickness of the layers grown during t1 and t2 periods being adjusted tuning the time duration of each of periods t1 and t2;

the thickness of the layers grown during t1 and t2 periods being adjusted by tuning the Gallium flow rate; and a growth duration of t1 or t2 periods being in the range of 1 second to 15 minutes.

17. The method of claim 1, wherein the Gallium source flow rate ranges from 0.01 L/min to 5 L/min during t2 period.

* * * * *